United States Patent [19]

Ishii et al.

[11] Patent Number: 4,605,944
[45] Date of Patent: Aug. 12, 1986

[54] LED ARRAY DEVICE FOR PRINTER

[75] Inventors: Toshihiko Ishii; Hiromi Takasu, both of Tottori, Japan

[73] Assignees: Sanyo Electric Co., Ltd., Osaka; Tottori Sanyo Electric Co., Ltd., Tottori, both of Japan

[21] Appl. No.: 649,340

[22] Filed: Sep. 11, 1984

[51] Int. Cl.⁴ .............................................. H01L 33/00
[52] U.S. Cl. ....................................... 357/17; 357/16; 357/45; 313/500
[58] Field of Search ............................. 357/45, 17, 16; 313/500, 499; 354/5, 12

[56] References Cited

U.S. PATENT DOCUMENTS

| | | | |
|---|---|---|---|
| 3,821,616 | 6/1974 | Kravitz | 313/500 |
| 3,850,517 | 11/1974 | Stephany et al. | 354/12 |
| 4,182,025 | 1/1980 | Wickenden | 357/45 |
| 4,318,597 | 3/1982 | Kotani et al. | 354/5 |

FOREIGN PATENT DOCUMENTS

| | | |
|---|---|---|
| 57-130451 | 8/1982 | Japan . |
| 58-125878 | 7/1983 | Japan . |
| 58-125879 | 7/1983 | Japan . |

OTHER PUBLICATIONS

Proceedings of the SID, vol. 23/2, 1982, pp. 81-84, "Optical Printer Using LED Array".
Nikkei Electronics, "LED Printer Emplying Amorphous Si Photosensitive Drum", pp. 92-95, Apr. 9, 1984.

Primary Examiner—James W. Davie
Assistant Examiner—Georgia Y. Epps
Attorney, Agent, or Firm—Armstrong, Nikaido, Marmelstein & Kubovcik

[57] ABSTRACT

An LED array device includes a plurality of LED units and a board for supporting the plurality of LED units. Each LED unit has a plurality of LED elements aligned straight in a predetermined pitch with a predetermined spacing between neighboring LED elements. The plurality of LED units are aligned straight with their end edges confronting each other such that an array of LED elements on one LED unit is in alignment with an array of LED elements on a next LED unit with the predetermined pitch being maintained. A spacing between an LED element positioned at the end of the alignment on the LED unit and the end edge of the LED unit is less than a half of the predetermined spacing.

11 Claims, 20 Drawing Figures

LED ARRAY DEVICE FOR PRINTER

BACKGROUND OF THE INVENTION

1. Field of the Invention

The present invention relates to an LED (light emitting diode) array device for use, for example, in a line printing device to form a latent image on a photoconductive surface. It also relates to a method for making such an LED array device.

2. Description of the Prior Art

The LED array device is generally defined by a plurality of monolithic LED array units, each unit containing a plurality of LED elements, such as 64 elements, aligned straight with a predetermined pitch, such as $\frac{1}{8}$ millimeter to 1/16 millimeter. The plurality of LED units are aligned to form an LED array device. Such an LED array device is disclosed, for example, in U.S. Pat. No. 3,850,517 to Stephany et al. issued Nov. 26, 1974, or in Proceedings of the SID, Vol. 23/2, 1982, pages 81 through 84, and entitled "Optical Printer Using LED Array", by K. Tateishi et al.

Referring to FIG. 1, LED elements 2, according to the prior art, are formed on a wafer 1 aligned in two orthogonal directions, and are particularly aligned in a predetermined pitch d1 in the horizontal direction. The light emission of an LED element 2 is actually effected at the boundary of the P region 11 where a PN junction is formed, as best shown in FIG. 2. Extending from each LED element 2 is an electrode 3 for the electric connection thereto. The wafer 1 is cut into chips along lines 4 and 5. The obtained chips 6 define LED array units, each having a size of, for example, 1×8 square millimeters. The cutting of wafer 1 is generally done by the steps of scribing the wafer surface along lines 4 and 5 which are parallel to the cleavage and applying pressure to break the wafer into chips. This method of cutting often results in a burr 7, such as shown in FIG. 2. The burr becomes greater as the thickness of the base 10 becomes bigger.

When LED units 6 so obtained are aligned to define an LED array device, burrs 7 results in undesirable spacing at a joint between jacent LED units 6, causing in a long pitch d2 between LED elements 2 on two LED units.

To solve the above problem, a number of arrangements for the LED array device have been proposed, and one of which is disclosed in U.S. Pat. No. 4,318,597 to Kotani et al. issued March 9, 1982. According to this patent, LED units are aligned not straight but in a zig-zag form. Another arrangement is disclosed in Japanese Utility Model Application Laid-Open Publication (Jikkaisho) No. 57-130451. According to this publication, LED units are aligned straight when viewed from the front, but alternately in two different levels, high and low. Accordingly, the jacent LED units do not touch each other.

According to the prior art arrangements described above, the positioning and holding the LED units at the proper positions are very difficult. Moreover, such a difficulty further results in the difficulty in the adjustment in the optical system.

SUMMARY OF THE INVENTION

The present invention has been developed with a view to substantially solving the above described disadvantages and has for its essential object to provide an improved LED array device which can be assembled straight with less deviation in the pitch of the LED elements, particularly at the joint of the LED units.

It is a further object of the present invention to provide an LED unit for use in assembling the abovementioned LED array device.

It is a still further object of the present invention to provide a method for making the above described LED unit.

It is also an essential object of the present invention to provide an LED array device wherein the diffused region 11 can be formed within the opening of the mask, thereby preventing any cross-talk and current leakage.

In accomplishing these and other objects, an LED array device according to the present invention comprises a plurality of LED units and a board for supporting the plurality of LED units. Each LED unit has a plurality of LED elements aligned straight in a predetermined pitch with a predetermined spacing between the neighboring LED elements. The plurality of LED units are aligned straight with their end edges confronting each other such that an array of LED elements on one LED unit is in alignment with an array of LED elements on a next LED unit with the predetermined pitch being maintained. A spacing between an LED element positioned at the end of the alignment on the LED unit and the end edge of the LED unit is less than a half of the predetermined spacing.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which:

FIG. 9b is a cross sectional view of an LED unit obtained from the wafer of FIG. 9a;

DESCRIPTION OF THE PREFERRED EMBODIMENTS

Figure 3:
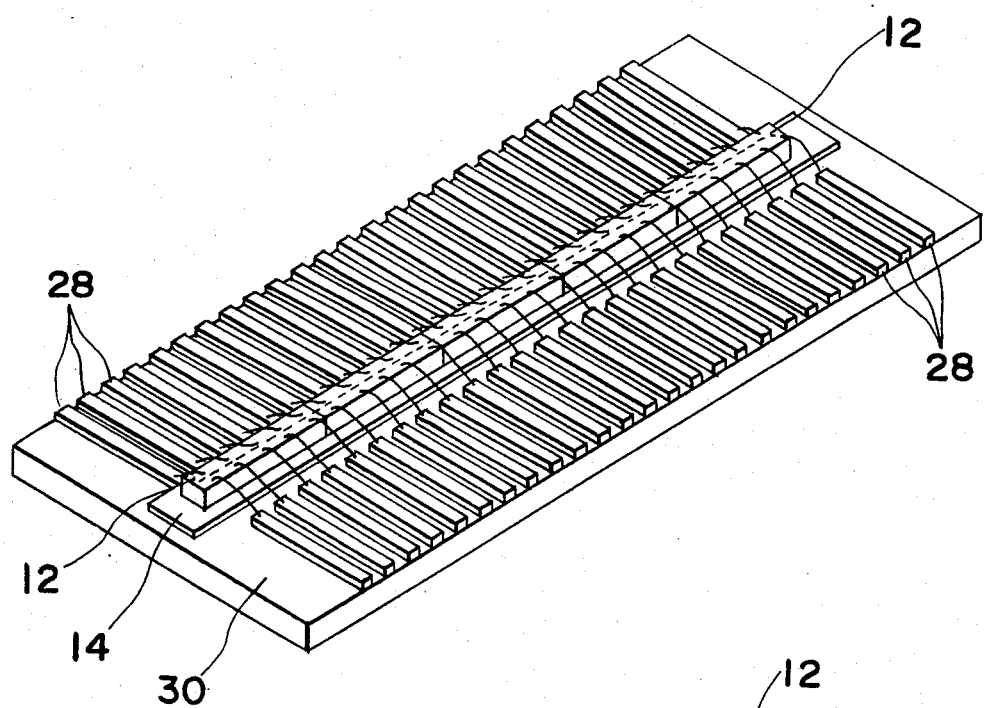
FIG. 3 is a perspective view of an LED array device according to the present invention.

Referring to FIG. 3, an LED array device according to the present invention includes a plurality of, such as five in the exemplification shown, LED array units 12 aligned straight on an conductor plate 14. In a different exemplification (not shown), there are twenty-eight LED array units 12 aligned straight. Conductor plate 14 is fixedly supported on a board 30.

Figure 4:
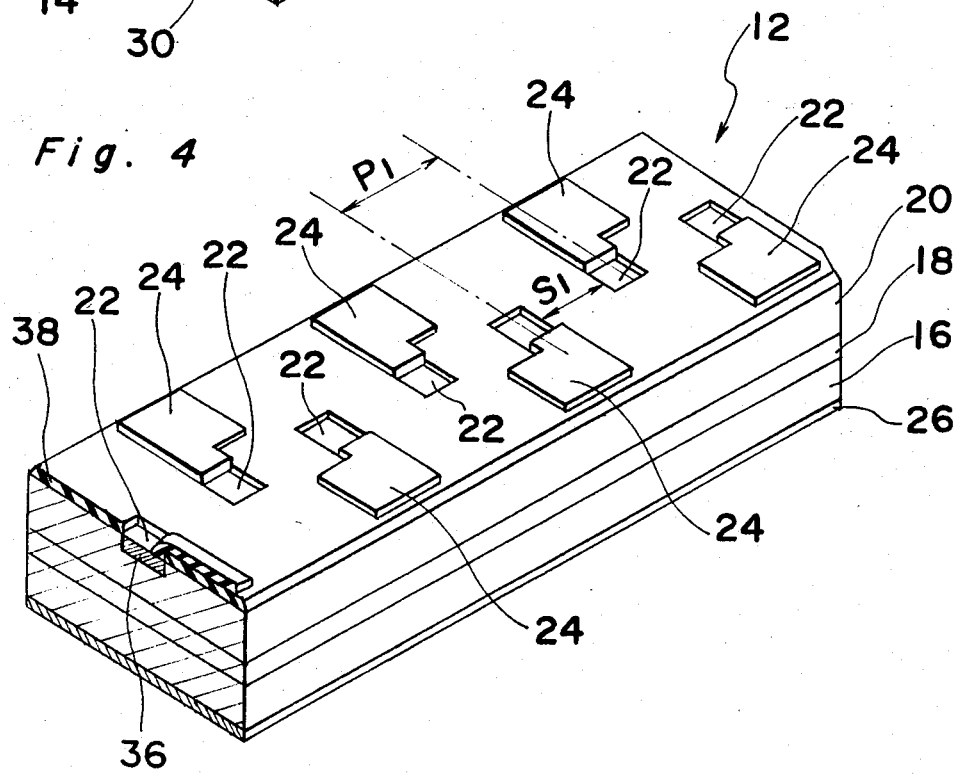
FIG. 4 is a perspective view of an LED unit in an enlarged scale.

Referring to FIG. 4, each LED unit 12 is defined by an elongated solid state chip made of N-type GaAs substrate 16 on which an N-type GaAsP epitaxial layers 18 and 20 are formed, whereas a plurality of regions 36, from which lights emit, are formed in layer 20. It is to be noted that a combination of substrate and layers 18 and 20 is generally referred to as a base. The size of the chip may be $1 \times 8$ square millimeters. The ratio of mixture of crystals GaAs and GaP in layer 20 is chosen in consideration of the wavelength which is the most sensitive to a photoconductive surface (not shown). In the case where the photoconductive material is made of an amorphous silicon, the most sensitive wavelength is 660 nanometer and, therefore, in this case, the ratio of GaAs to GaP is chosen to be 0.6 to 0.4. This compound is expressed as $GaAs_{0.6}P_{0.4}$.

The layer 20 is formed with a plurality of, such as eighty LED elements 22 by the steps of diffusion using masks. The LED elements 22 are aligned straight and are disposed at a predetermined pitch P1, such as 100 micrometers. The size of each LED element 22 is, for example, 50 micrometer square, with a spacing S1 between neighboring LED elements being 50 micrometers. The steps for forming the LED elements 22 will be described in detail later in connection with FIGS. 8a-8h.

The LED unit 12 is further provided with an electrode 24 extending from each LED element 22 for the external connection, and a common electrode 26 provided on an entire bottom surface of substrate 16.

Referring again to FIG. 3, electrodes 24 are wired to terminals 28 which are supported on board 30.

Next, the steps for forming LED units 12 according to the present invention is described.

Figure 5:
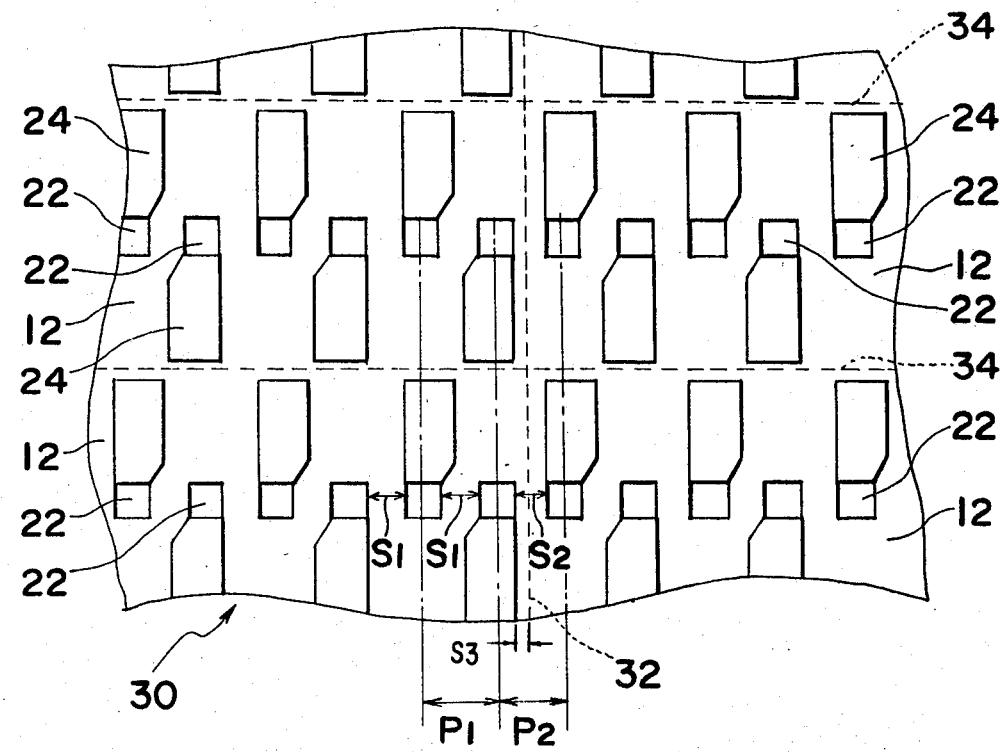
FIG. 5 is a fragmentary top plan view of a wafer with LED elements, according to the present invention.

Referring to FIG. 5, a wafer 30 is shown on which a plurality of LED elements 22 are aligned vertically and horizontally. Wafer 30 is then cut along line 32 by the steps of scribing the wafer surface along line 32 which are parallel to the cleavage and applying pressure to break the wafer into parts. Then, wafer 30 is cut along line 34 by the step of dicing or by the steps of scribing and breaking. As shown in FIG. 5, LED elements 22 are aligned horizontally with a spacing S1 between neighboring LED elements 22 except between LED elements 22 where line 32 extends. The spacing between LED elements 22 where line 32 extends is S2 which is smaller than S1. For example, S1 is equal to 100 micrometers and S2 is equal to 70-80 micrometers. Accordingly, when wafer 30 is cut particularly along line 32, a spacing S3 between an LED element 22 located at the end of the cut chip and a cut edge is about 35-40 micrometers, which is less than $\frac{1}{2}$ of the spacing S2. Accordingly, even when a burr, which is empirically found out to be about 5 micrometers or less, is produced, LED elements 22 can be aligned with a constant spacing S1 even at the joint between LED units 12, as shown in FIG. 6.

Figure 6:
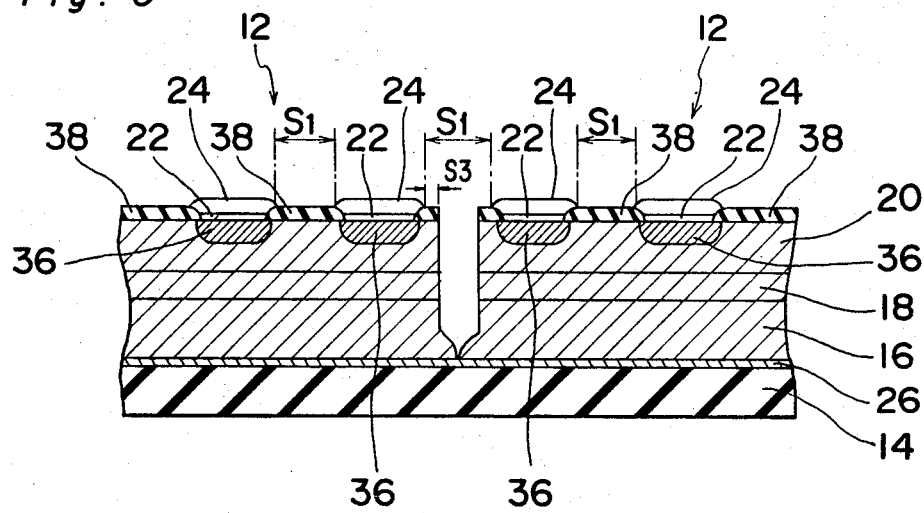
FIG. 6 is a cross sectional view of aligned LED units, particularly showing a joint between units, according to the present invention.

Referring to FIG. 6, each LED element 22 is formed by the step of diffusion of dopants into a solid crystal layer 20 using a suitable mask 38. The diffusion is effected in the depth direction and also in sideways, thereby defining a diffused region, such as P region 36 not only within the opening of the mask 38, but also partly under the mask 38.

According to the LED element 22 shown in FIG. 6, since the diffused region 36 expands wider than the opening of the mask 38, an undesirable cross-talk may take place between adjacent LED elements due to the light leakage through the base. Also, if wafer 30 is cut along line 32, but happens to be very close to the diffused region 36 or even across the diffused region 36, undesirable current leakage may be produced, resulting in the reduction of radiant intensity and shortening the life time of the LED element. To eliminate the above disadvantage, an improved arrangement is given below.

Figure 7:
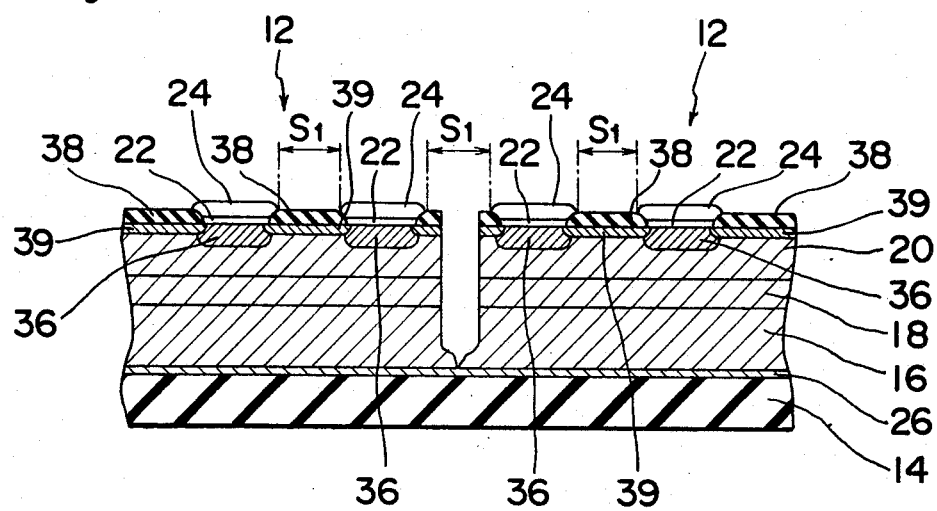
FIG. 7 is a view similar to FIG. 6, but particularly showing a modification thereof.

Referring to FIG. 7, a modification is shown. An LED element 22 according to this modification is defined by a P region 36 formed in alignment with an opening defined by a mask 38. To prevent the expansion of P region 36 under the mask 38, an over compensated N region 39 is formed under the mask 38.

Various sizes for the arrangement of LED elements formed on a wafer are given in Table 1 below.

TABLE 1

| Resolving Power (dot/mm) | Length of One side of square LED (μm) | Normal Portion | | Cutting Portion | |
|---|---|---|---|---|---|
| | | Pitch P1 (μm) | Spacing S1 (μm) | Pitch P2 (μm) | Spacing S2 (μm) |
| 9.45 | 60 | 105.5 | 45.5 | 95.5 | 35.5 |
| 12 | 50 | 84.5 | 34.5 | 74.5 | 24.5 |
| 16 | 40 | 62.5 | 22.5 | 52.5 | 12.5 |

Now, the steps for forming an LED element 22, shown in FIG. 7, on wafer 30 will be described below.

Figure 8A:
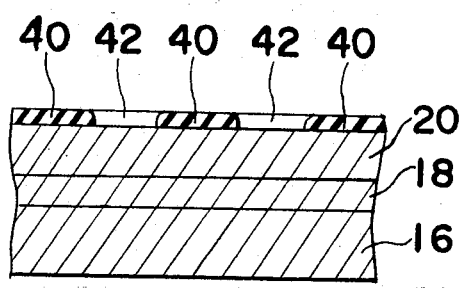
FIGS. 8a to 8h are cross sectional views showing the steps for making LED elements, according to the present invention.

Referring to FIG. 8a, on the N-type GaAsP epitaxial layer 20 of wafer 30, a mask 40 having square openings 42 is formed by the step of, for example, CVD (chemical vapor deposition) and photolithography.

Figure 8E:
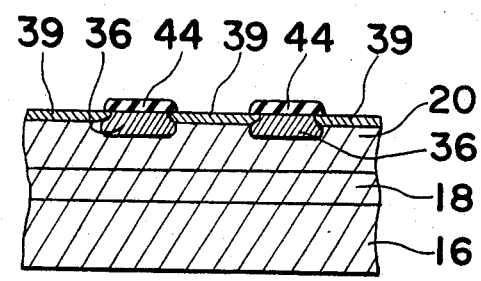
Figure 8B:
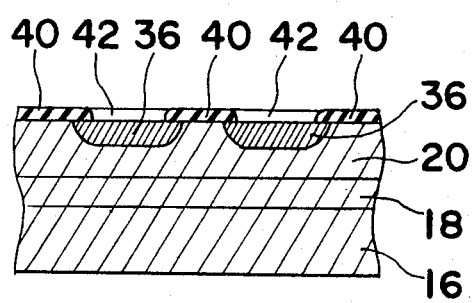

Then, as shown in FIG. 8b, the P region 36 is formed through the step of diffusion of dopants, such as zinc, into the solid crystal layer 20 at openings 42, e.g., for four hours under the temperature of 750° C. At this step, the diffusion of dopants is effected in the depth-direction and also in the side-direction. Accordingly, as illustrated in FIG. 8b, P region 36 expands partly under the mask 40. The boundary of P region 36 defines a PN junction at which the light emission is effected. P region 36 has a configuration similar to a deep round bowl, and its depth is about 2-5 micrometers, typically 2.5 micrometers.

Figure 8F:
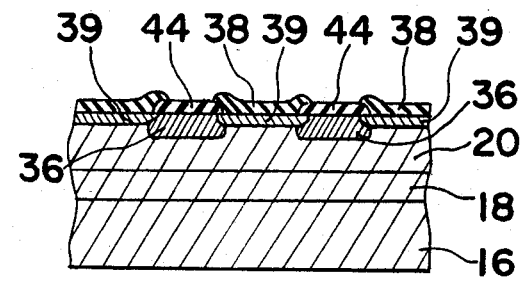
Figure 8C:
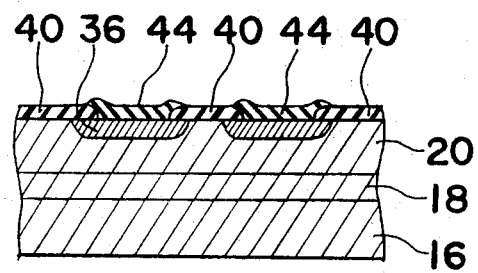
Figure 8G:
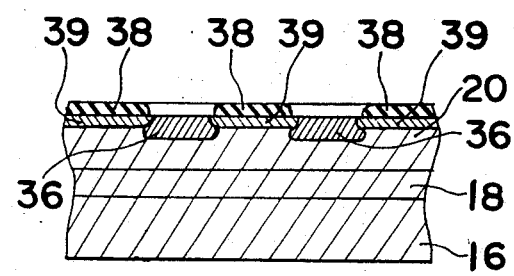
Figure 8D:
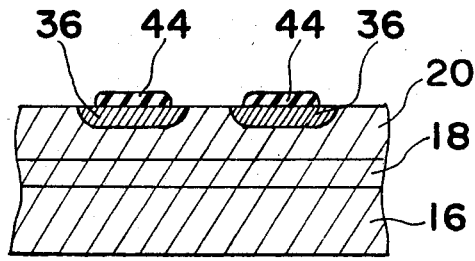

Next, as shown in FIG. 8c, another mask 44, which is made of a material different from the mask 40, is provided at places uncovered by mask 40, that is at openings 42. Then, as shown in FIG. 8d, mask 40 is removed. Thus, at this stage, mask 44 is provided on top of each P region 36. Since each part of mask 44 is slightly smaller than P region 36, a perimeter of P region 36 is uncovered by mask 44.

Then, as shown in FIG. 8e, the over compensated N region 39 is formed through the step of diffusion of dopants, such as sulfur or tellurium, into the layer 20 at places uncovered by mask 44. The diffusion is carried out in the depth direction and also in the side direction. Therefore, the over compensated N region 39 expands partly under the mask 44. This will result in the reduction of size of P region 36 such that the P region 36 is now complete covered by mask 44. The depth of the diffusion is shallow, such as 0.5–1.3 micrometers, when compared with that of P region 36, so as to avoid any undesirable influences given to the bottom of P region 36. According to the preferred embodiment, since the vaporization temperature of sulfur or tellurium is higher than that of zinc, the diffusion in this stage is carried out in a short period of time, e.g., one hour with a gradiation in the temperature distribution such that the temperature of the dopants is raised to about 1000° C., whereas that of the wafer is raised to about 700° C. Instead of the above method, the over compensated N region 39 can be formed by the step of ion injection method. In this manner the segregation of zinc in P region 36 can be avoided.

It is to be noted that the step for forming P region 36 can be carried out after over compensated N region 39 is formed. This alternative method is suitable when P region 36 is susceptible to segregation. In such a case, it is preferable to prepare the mask 44 smaller than the above method.

Then, as shown in FIG. 8f, a further mask 38 is provided at places uncovered by mask 44. At the next stage, as shown in FIG. 8g, mask 44 is removed. Accordingly, mask 38 substantially has the same pattern as the first mask 40.

Figure 8H:
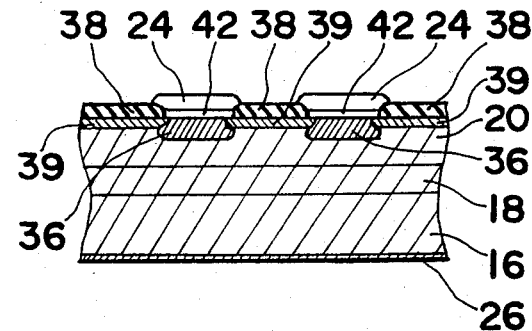

Finally, as shown in FIG. 8h, electrode 24 is provided which extends from each P region 36, and common electrode 26 is also provided.

It is to be noted that, in the case where the mask is made of a material that blocks some substances but permits some other substances to penetrate therethrough, it is not necessary to remove the first mask 40.

It is also to be noted that, for making the LED element shown in FIG. 6, steps shown in FIGS. 8c–8h are not necessary. After P region 36 is made (FIG. 8b), electrode 24 is deposited.

As is apparent to those skilled in the art, when a suitable voltage is applied between electrode 24 and common electrode 26, light is emitted from the PN junction which is defined at the boundary of P region 36. Since the area of the bottom of P region 36 is the same as that in the prior art, there is no reduction of light amount that can be emitted through opening 42, when compared with the prior art devices. Furthermore, since the side faces of P region 36 is surrounded by over compensated N region 39, the light emitted from the side faces of P region 36 is reduced, thereby reducing undesirable cross-talks.

Furthermore, according to the present invention, since P region 36 is located within opening 42 and does not extend under mask 38, P region 36, which substantially defines the LED element, will not be damaged so long as the cutting is effected on mask 38. Moreover, it is possible to narrow the spacing between LED elements.

Figure 9A:
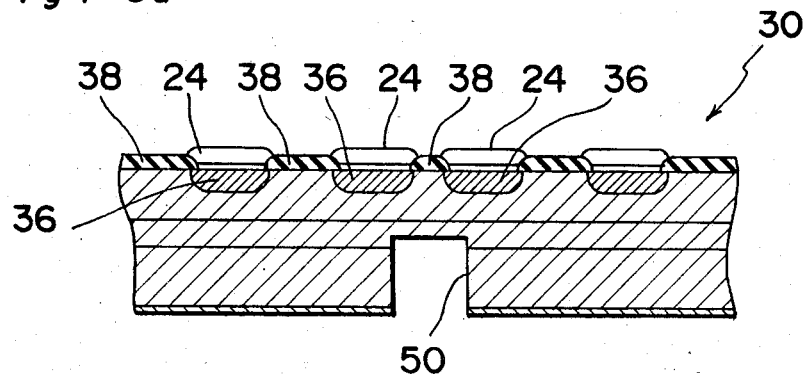
FIG. 9a is a cross sectional view of a wafer according to another modification of the present invention.
Figure 9B:
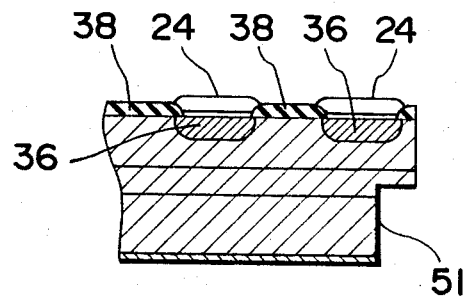
Figure 10:
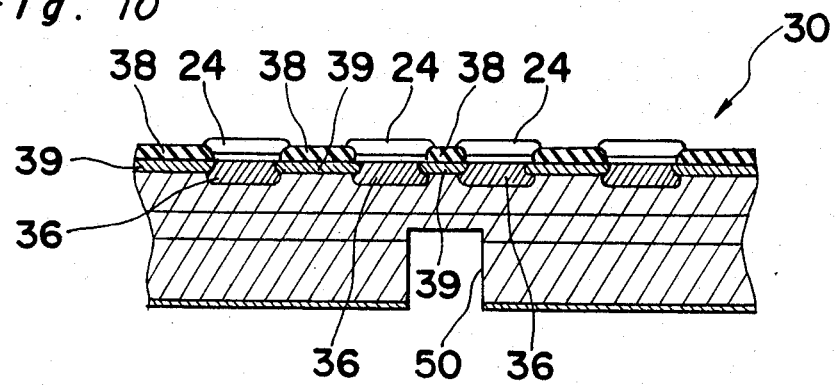
FIG. 10 is a cross sectional view of a wafer according to a further modification of the present invention.

Referring to FIGS. 9a and 10, cross-sectional views of a wafer 30 are shown. Particularly, FIG. 9a shows a case wherein no over compensated N regions 39 is provided, and FIG. 10 shows a case wherein over compensated N regions 39 are provided. Before cutting wafer 30 into chips, a suitable groove 50 is formed on the bottom face of wafer 30 in parallel to and immediately under lines 32 and 34. Such grooves 50 are formed before the scribing and can be formed by the use of a dicing saw. When wafer 30 is cut by scribing, LED units, such as shown in FIG. 9b, are obtained. Because grooves 50 are formed in wafer 30, an indentation 51 is formed at the bottom edge of each LED unit. Such an indentation 51 prevents the production of undesirable burrs. A similar indentation is formed when wafer 10 is cut into chip. The arrangement of FIG. 9a or 10 is suitable particularly when the thickness of the wafer is relatively thick, such as 350 micrometers. In this case, the size of groove 50 may be such that the width is 200 micrometers and the depth is 150 micrometers.

Figure 11:
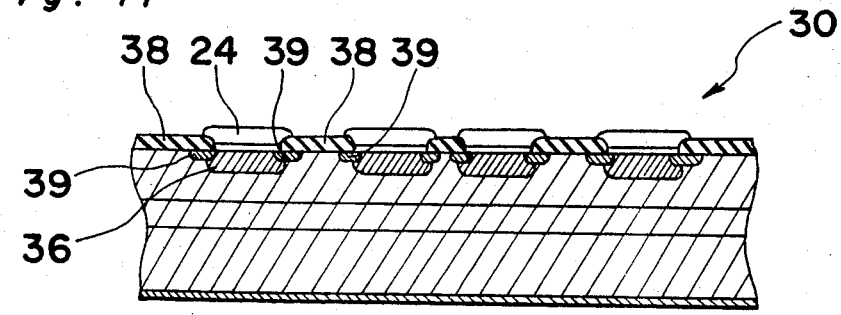
FIG. 11 is a cross sectional view of a wafer according to yet another modification of the present invention.

Referring to FIG. 11, a cross-sectional view of a wafer 30 according to another modification is shown. Instead of all the remaining areas between P regions 36, the over compensated N regions 39 are formed only around P regions 36. This arrangement also has the same merits as in the above described embodiment.

According to the present invention, the relationship between the P region and N region in the above given examples can be made opposite. For example, region 36 can be prepared as N-type, and region 39 is prepared as P-type.

According to the tests carried out by the present inventors, it has been found that the number of LED units, which have a good quality, produced by the steps according to the present invention is improved as indicated in Table 2 below.

TABLE 2

Figure 1:
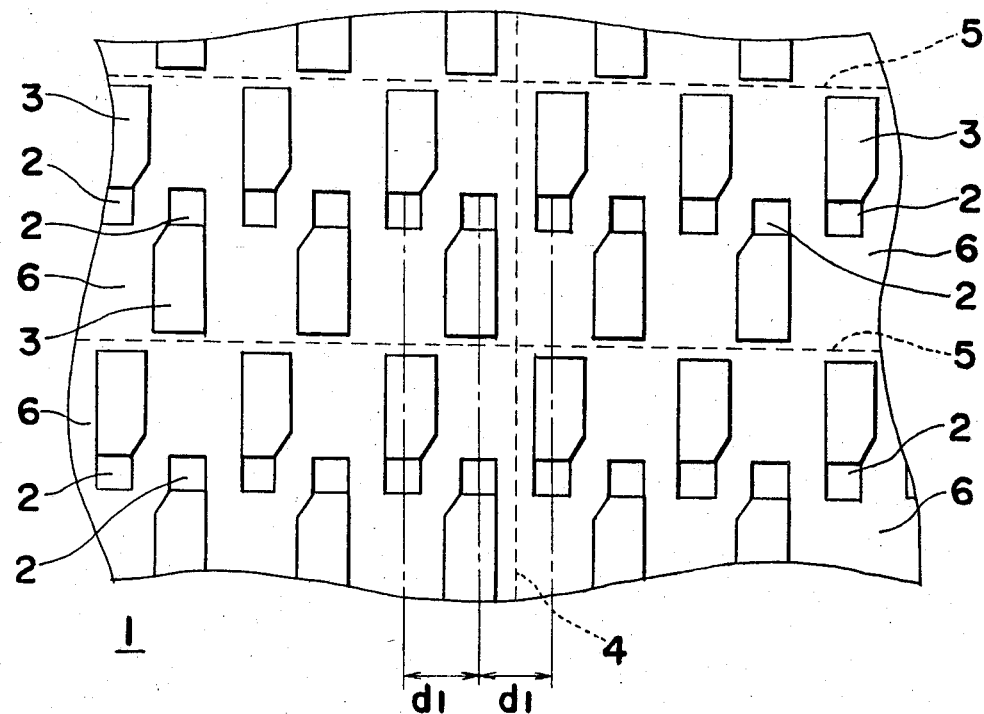
FIG. 1 is a fragmentary top plan view of a wafer with LED elements, according to the prior art.
Figure 2:
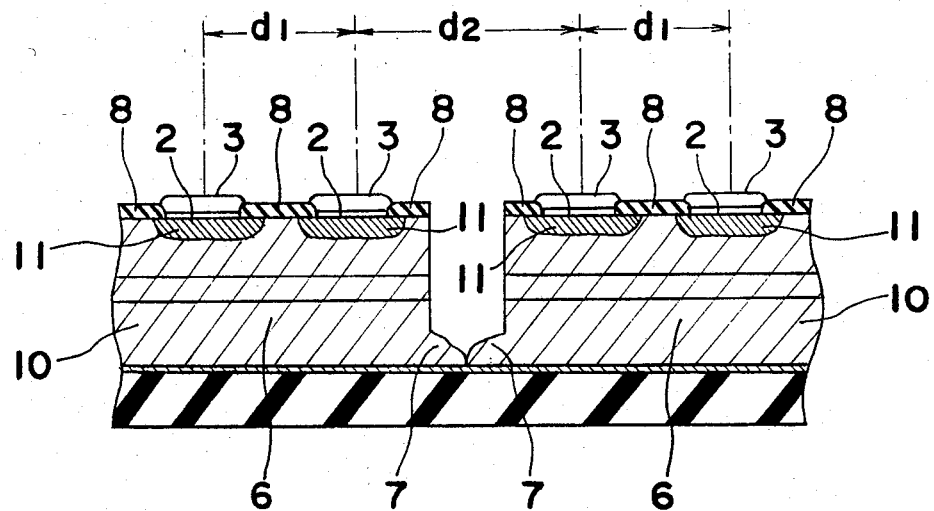
FIG. 2 is a cross sectional view of aligned LED units, particularly showing a joint between units, according to the prior art.

| Test Pieces Thickness | Prior art Arrangement of FIG. 1 200 μm | Present Invention Arrangement of FIG. 5 200 μm | Present Invention Arrangement of FIG. 9 350 μm |
|---|---|---|---|
| In Wafer | 300 | 300 | 300 |
| After Cut | 200 | 172 | 290 |
| After aligned | 64 | 96 | 274 |

As apparent from Table 2, according to the prior art, out of 300 good quality LED units on a wafer, 200 LED units are still in good quality after cutting the wafer into chips, and only 64 LED units are in good quality after the chips in a manner, such as shown in FIG. 3.

According to the present invention, out of 300 good quality LED units on a wafer, 172 LED units are in good quality after cutting the wafer into chips, and 96 LED units are in good quality after the chips in a manner, such as shown in FIG. 3. When compared with the prior art, the number of LED units after the alignment was improved from 64 to 96. This number was greatly improved when the embodiment of FIG. 9 or 10 is employed.

Figure 12:
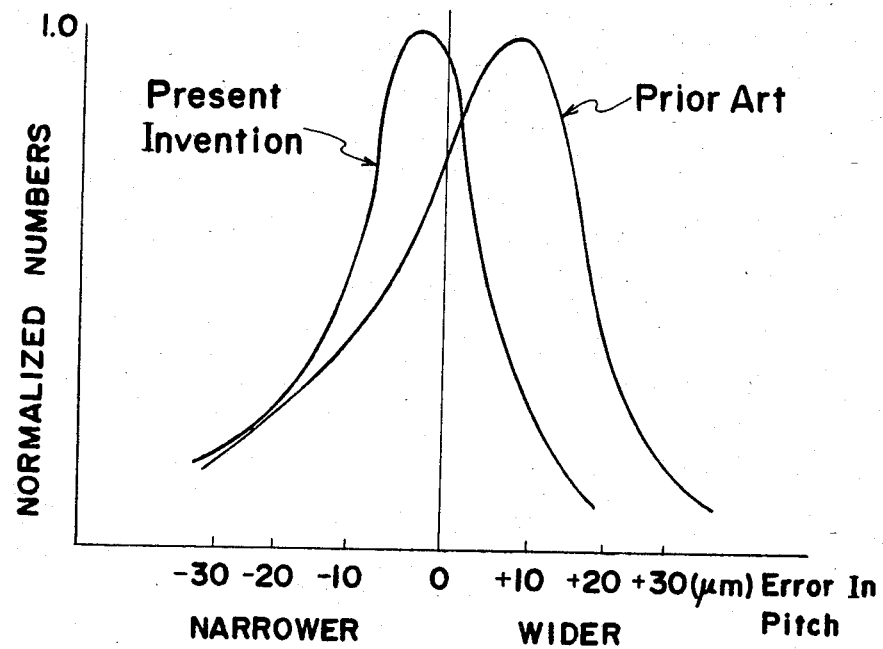
FIG. 12 is a graph showing a degree of deviation in pitch.

According to the statistics taken by the present inventors as indicated in FIG. 12, the error in the pitch between two LED elements bridging two LED units in the LED array device of the present invention is very small and tends to be a little narrower than the required pitch. According to the prior art, the error for the same is rather large and tends to be wider than the required pitch. It is understood that the error in the narrower side is more acceptable than that in the wider side, because, when a straight line is printed, the LED elements disposed with a narrow pitch will result in a clear and distinct line, but with a wider pitch, there will be discontinuities in the straight line.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of appended claims.

What is claimed is:

1. An LED array device comprising:
    a plurality of LED units, each having a plurality of LED elements aligned straight in a predetermined pitch with a predetermined spacing between neighboring LED elements, said plurality of LED units aligned straight with their end edges confronting each other such that an array of LED elements on one LED unit is in alignment with an array of LED elements on a next LED unit with said predetermined pitch being maintained, a spacing between an LED element positioned at the end of said LED unit and said end edge of said LED unit being less than a half of said predetermined spacing;
    an electrode means extending from each LED element; and
    board means for supporting said plurality of LED units.

2. A wafer comprising:
    a base made of a semiconductor;
    a plurality of LED elements formed on said base and aligned in first and second directions which are orthogonal to each other, the alignment of said LED elements in said first direction being a first LED unit such that a predetermined number of LED elements are aligned with a first predetermined spacing between neighboring LED elements, and that a second LED unit with an alignment of said predetermined number of LED elcments is repeated with a second predetermined spacing between adjacent LED elements of said first and second LED units which second predetermined spacing is less than said first predetermined spacing; and
    an electrode extending from each of said LED elements.

3. An LED unit comprising:
    a base made of a semiconductor;
    a plurality of LED elements formed on said base and aligned straight in a predetermined pitch with a predetermined spacing between neighboring LED elements, a spacing between an LED element positioned at the end of said LED elements and a corresponding end edge of said base being less than a half of said predetermined spacing.

4. An LED unit as claimed in claim 3, wherein said base has an indentation formed at said end edge and at a portion below said LED element positioned at the end of the said alignment.

5. An LED unit as claimed in claim 3, wherein said base comprises $GaAs_{0.6}P_{0.4}$ layer.

6. An LED unit as claimed in claim 3, wherein each of said LED elements comprises:
    a mask deposited on said base said mask having a opening;
    a first region having one of the two conductivity types and being defined in said base substantially in alignment with said opening, said first region defining a PN junction at a boundary thereof, serving as a light emitting portion; and
    a second region having an other of the two conductivity types and being defined in said base at a portion at least surrounding said first region.

7. An LED unit as claimed in claim 6, wherein said first region has a diffusing surface smaller than a diffused bottom area.

8. An LED unit as claimed in claim 6, wherein said first region is a P-type and said second region is an over compensated N-type.

9. An LED unit as claimed in claim 6, wherein said first region is formed by the diffusion of zinc for dopant.

10. An LED unit as claimed in claim 9, wherein said second region is formed by the diffusion of sulfur or tellurium for dopant.

11. An LED unit as claimed in claim 3, further comprising a common electrode deposited on said base on a surface opposite to the surface provided with said first region.

* * * * *